United States Patent [19] [11] Patent Number: 4,898,840
Okuyama [45] Date of Patent: Feb. 6, 1990

[54] SEMICONDUCTOR INTEGRATED CIRCUIT DEVICE AND A METHOD OF PRODUCING THE SAME

[75] Inventor: Kousuke Okuyama, Kawagoe, Japan

[73] Assignee: Hitachi, Ltd., Tokyo, Japan

[21] Appl. No.: 269,702

[22] Filed: Nov. 10, 1988

[30] Foreign Application Priority Data

Nov. 13, 1987 [JP] Japan .................................. 62-285318

[51] Int. Cl.[4] ..................... H01L 21/00; H01L 21/02; H01L 21/265; B01J 17/00
[52] U.S. Cl. ........................................ 437/41; 437/43; 437/48; 437/52; 357/23.5; 365/104; 365/185
[58] Field of Search ....................... 437/27, 41, 43, 45, 437/48, 51, 52; 365/94, 102, 103, 104, 185; 357/23.12, 23.5

[56] References Cited

U.S. PATENT DOCUMENTS

| 4,295,209 | 10/1981 | Donley | 365/178 |
|---|---|---|---|
| 4,332,077 | 6/1982 | Hsu | 437/84 |
| 4,342,100 | 7/1982 | Kuo | 365/104 |
| 4,364,165 | 12/1982 | Dickman et al. | 437/48 |
| 4,364,167 | 12/1982 | Donley | 437/45 |
| 4,458,406 | 7/1984 | DeLaMoneda et al. | 437/52 |
| 4,500,975 | 2/1985 | Shirato | 365/104 |
| 4,612,212 | 9/1986 | Masuoka et al. | 437/43 |
| 4,818,716 | 4/1989 | Okuyama et al. | 437/28 |

FOREIGN PATENT DOCUMENTS 0041188 4/1978 Japan .
0042168 2/1986 Japan .

Primary Examiner—Brian E. Hearn
Assistant Examiner—B. Everhart
Attorney, Agent, or Firm—Antonelli, Terry & Wands

[57] ABSTRACT

A semiconductor integrated circuit device having a read-only memory which comprises a plurality of first gate electrodes arranged on a semiconductor substrate in a first direction maintaining a predetermined distance, a plurality of second gate electrodes that are arranged among said first gate electrodes and are partly overlapped on said first gate electrodes, and regions of data-writing impurities positioned under the first and second gate electrodes. The impurities for writing data are introduced through the first or second gate electrodes using the overlappings of the first and second gate electrodes as masks.

12 Claims, 6 Drawing Sheets

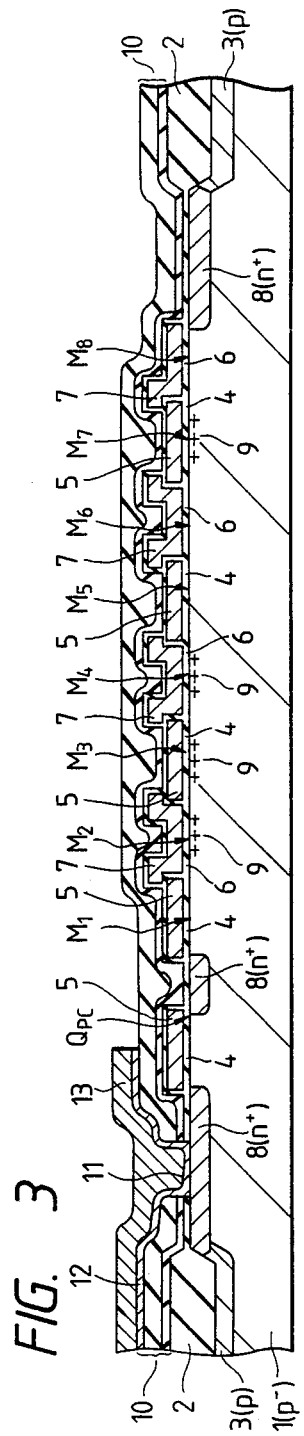
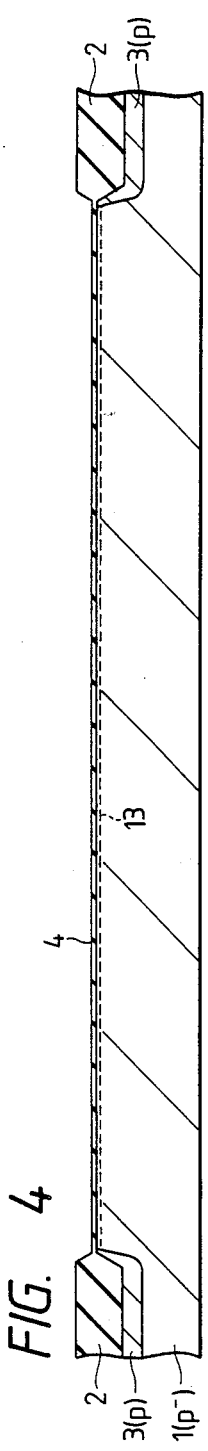
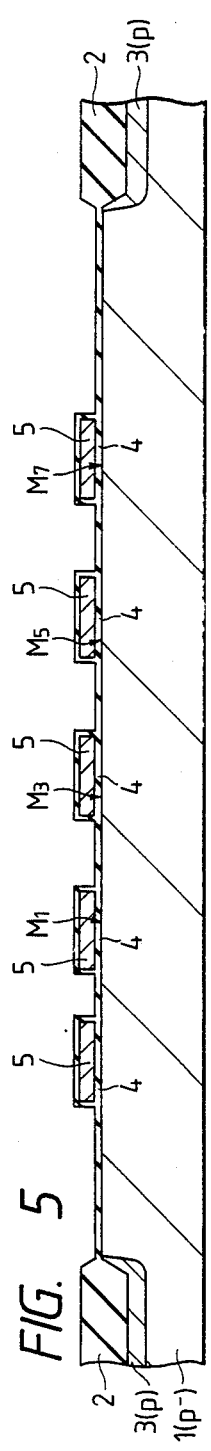
FIG. 3
FIG. 4
FIG. 5

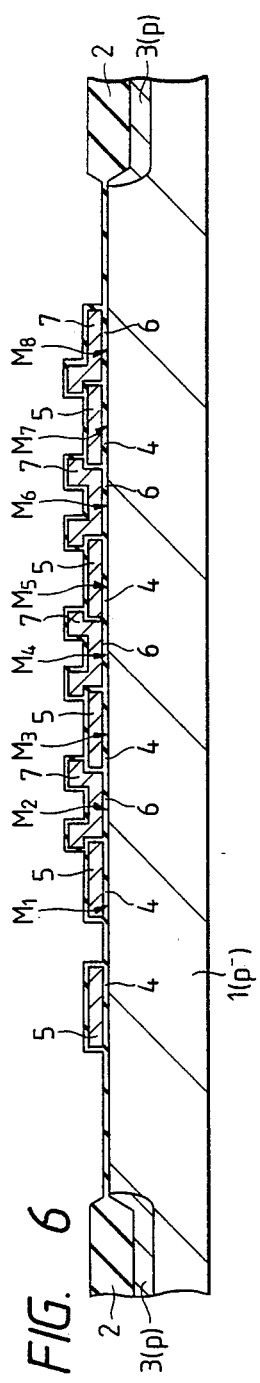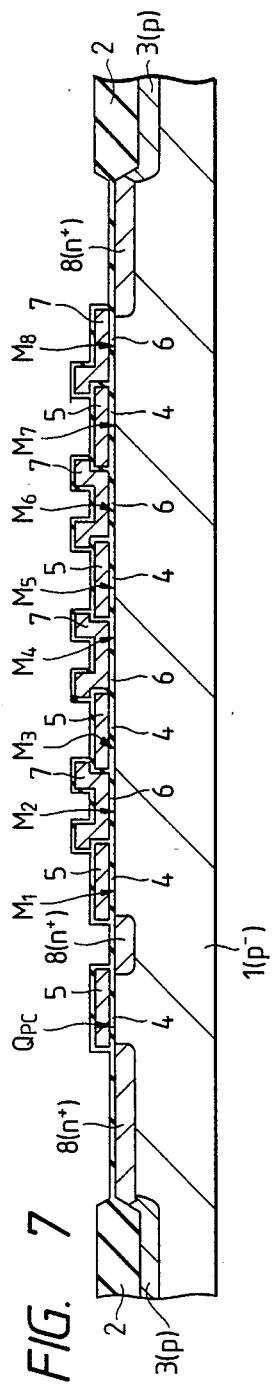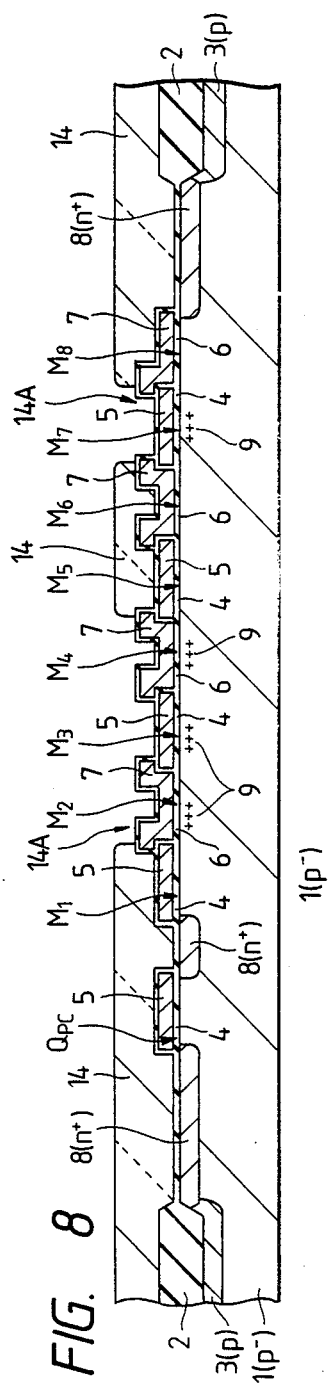

SEMICONDUCTOR INTEGRATED CIRCUIT DEVICE AND A METHOD OF PRODUCING THE SAME

BACKGROUND OF THE INVENTION

The present invention relates to a semiconductor integrated circuit device and a method of producing the same. More specifically, the invention relates to a semiconductor integrated circuit device having a mask ROM and to technology that can be effectively adapted to a method of producing the same.

The mask ROM's include a lateral mask ROM that is advantageous for high-speed operation and a vertical mask ROM that is advantageous for being highly densely integrated.

In the field of vertical mask ROM, a double-layer gate structure (multi-gate structure) has been employed for the purpose of accomplishing a highly dense integration. The vertical mask ROM of the double-layer gate structure has been disclosed in Japanese Patent Laid-Open No. 41188/1978.

The double-layer gate structure consists of second gate electrodes arranged among the first gate electrodes arranged in the direction of the gate length maintaining a predetermined distance. The first gate electrodes are composed of a gate electrode material (polycrystalline silicon film) of the first layer, and the second gate electrodes are composed of a gate electrode material (polycrystalline silicon film) of the second layer. Ends of the first gate electrodes and ends of the second gate electrodes have been overlapped by amounts that correspond to margin for aligning the mask in the step of manufacturing.

The thus constituted vertical mask ROM makes it possible to eliminate a portion that corresponds to the source region or the drain region between the first gate electrodes and the second gate electrodes. That is, the vertical mask ROM of this type enables the areas of the memory cell array to be reduced in the direction of gate length and, hence, enables the degree of integration to be increased.

The data are written onto the vertical mask ROM prior to forming the first gate electrodes and the second gate electrodes. That is, the data are written onto the vertical mask ROM in a way as described below.

First, impurities for writing data are selectively introduced into the channel forming regions in the main surface of a semiconductor substrate. The impurities for writing data form depletion-type MISFET of a conductivity type opposite to that of the semiconductor substrate.

Then, first gate electrodes and second gate electrodes are formed in positions in a region where the impurities for writing data are introduced.

SUMMARY OF THE INVENTION

The present inventor has studied the above-mentioned technology and has found problems as described below.

In the vertical mask ROM in which the data have been written prior to forming the gate electrodes, extended periods of time are required for completing the product after the data have been written into the ROM.

In the vertical mask ROM, furthermore, the first gate electrodes and the second gate electrodes must be formed in positions in the region in which are introduced impurities for writing data. Therefore, the gates in the direction of gate length and/or the size of the region in which are introduced impurities for writing data must have a margin by taking into consideration the masking deviation between the region in which are introduced impurities for writing data and the first and second gate electrodes. Because of the above reasons, the integration degree of the vertical mask ROM cannot be decreased.

Furthermore, the masking deviation results in a deviation between the gates and the channel regions causing the gate length to be substantially changed. Therefore, the mutual conductance gm of a MISFET constituting a memory cell undergoes the change. Namely, erroneous operation takes place in reading out the data. Variance in the mutual conductance gm that depends upon the manufacturing process causes the vertical mask ROM in which the memory cells are connected in series to operate erroneously.

The object of the present invention is to provide technology which is capable of reducing the time required from the writing of data to the completion of the product in a semiconductor integrated circuit device having vertical mask ROM.

Another object of the present invention is to provide technology which is capable of reducing the areas occupied by the memory cells to increase the degree of integration in a semiconductor integrated circuit device having vertical mask ROM.

A further object of the present invention is to provide technology which does not permit the mutual conductance gm of MISFET that constitutes a memory cell to change irrespective of the manufacturing processes for producing semiconductor integrated circuit devices having vertical mask ROM.

The above and other objects of the present invention as well as novel features thereof will become obvious from the description of the specification and the accompanying drawings.

Among the inventions disclosed in the present application, a representative example will be briefly described below.

That is, in a semiconductor integrated circuit device of the double-layer gate structure having vertical mask ROM, first gate electrodes and second gate electrodes are successively formed, and then impurities for writing data are introduced into a channel-forming region through a predetermined first gate and/or a second gate electrode thereby to write data.

Further, the impurities for writing data are introduced without passing through a portion where the end of the first gate electrode and the end of the second gate electrode are overlapped.

BRIEF DESCRIPTION OF THE DRAWINGS

FIG. 3 is a section view illustrating a major portion of memory cell constitution in the vertical mask ROM according to the present invention;

FIGS. 4 to 8 are section views illustrating major portions in each of the manufacturing steps for explaining a method of producing the vertical mask ROM according to the present invention;

DESCRIPTION OF THE PREFERRED EMBODIMENTS

Figure 1:
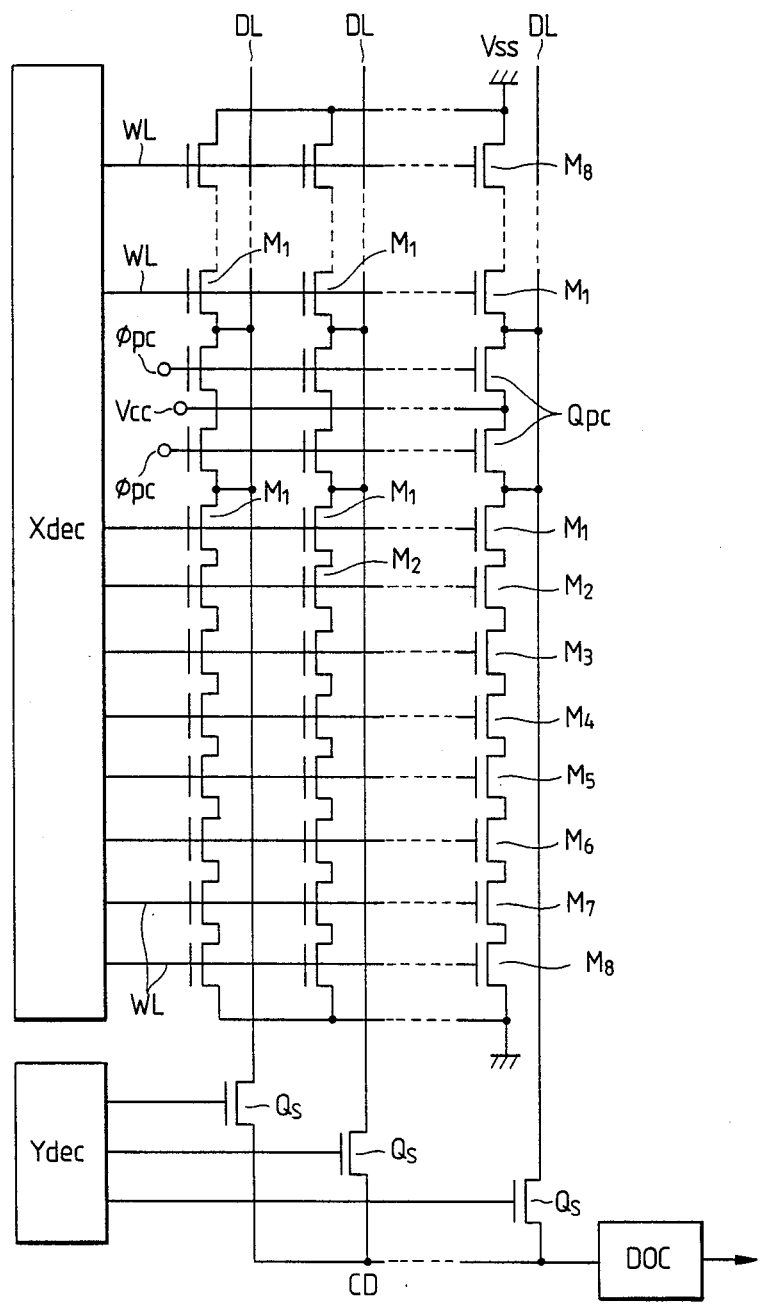
FIG. 1 is a diagram of an equivalent circuit of a memory cell portion and a peripheral portion thereof in a vertical mask ROM according to the present invention.

FIG. 1 is a diagram of an equivalent circuit of the vertical mask ROM according to the present invention.

Referring to FIG. 1, a memory cell array in the vertical mask ROM have arranged therein memory cells $M_1$ to $M_8$ that are composed of MIS capacities or MISFET's (hereinafter simply referred to as MISFET's). The memory cells Ml to M8 are connected in series. Memory cells M1 to M8 of a number of eight (or 16, 32, ...) constitute a unit memory cell row consisting of eight bits (or 16 bits, 32 bits, ...).

The memory cell M consists of a MISFET of the depletion type (first threshold voltage) that forms data "0" or of the enhancement type (second threshold voltage) that forms data "1". Word lines WL that extend in the direction of column are connected to the gate electrodes of the memory cells M1 to M8, such that the memory cells M are rendered conductive or nonconductive. Each word line WL is connected at its one end to an X-decoder circuit Xdec.

The memory cell M1 in the unit memory cell row is connected to a data line DL that extends in the row direction. Concretely speaking, the drain of a MISFET that constitutes the memory cell M1 is connected to the data line DL that extends in the row direction, and the gate electrode thereof is connected to a power source voltage Vcc via a precharging MISFET Qpc that receives a precharge signal $\phi$pc. The power source voltage Vcc may be, for example, 5 volts to operate the circuit. The data lines DL are connected at the ends on one side to a common data line CD via MISFET's Qs that constitute column switches. The gate electrodes of MISFET's Qs are connected to a Y-decoder circuit Ydec. The source of MISFET that constitutes memory cell M8 at the other end of the memory cell row is connected to a reference voltage Vss. The reference voltage Vss is, for example, ground potential (0 volt) of the circuit. As will be described later, the power source voltage Vcc and the reference voltage Vss are commonly provided for a plurality of unit memory cell rows that are arranged in the column direction, and constitute wiring for power source voltage and wiring for reference voltage, respectively.

Each pair of unit memory cell rows form a symmetrical shape in the row direction with the precharging MISFET Qpc as a center. Each pair of unit memory cell rows are arranged in the column direction maintaining the same pattern to constitute the memory cell array.

Figure 2:
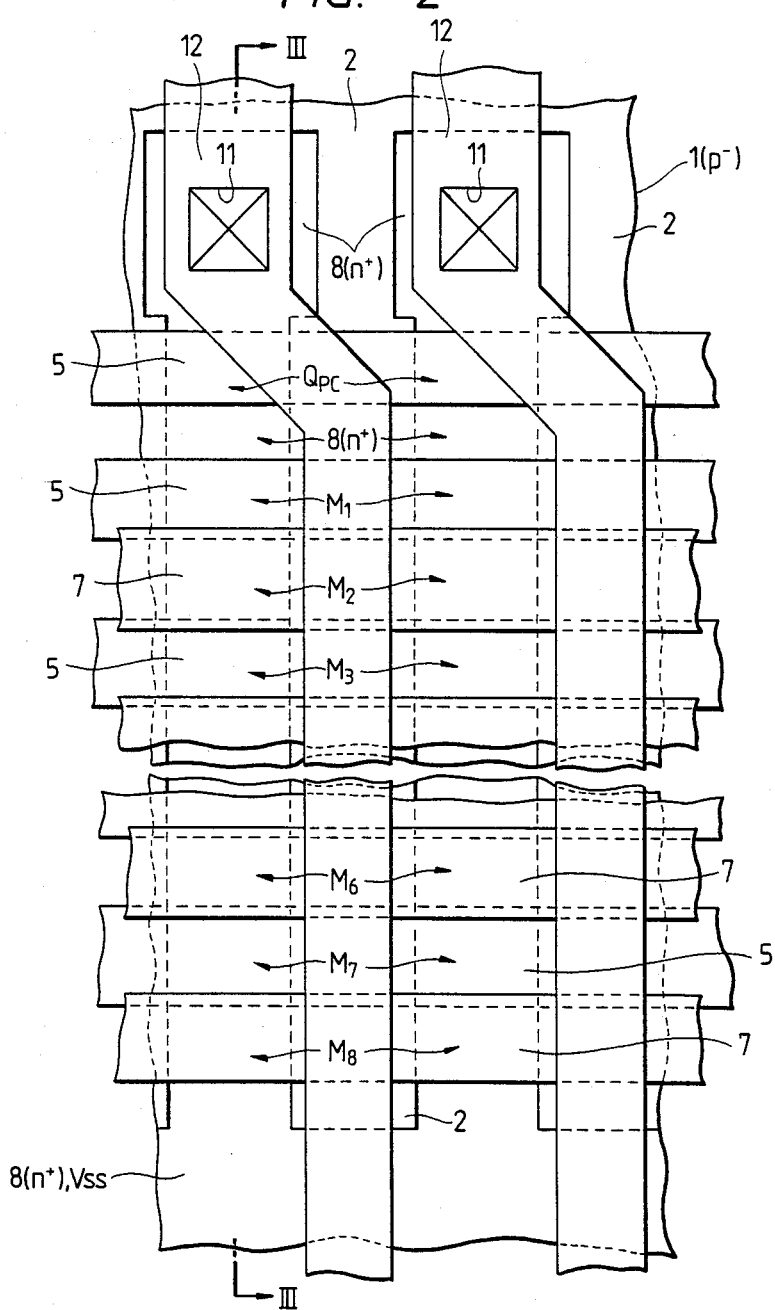
FIG. 2 is a plan view illustrating a major portion of the memory cell array in the vertical mask ROM according to the present invention.

FIG. 2 is a section view showing a major portion of the memory cell array in the vertical mask ROM according to the present invention, and FIG. 3 is a section view along the line III—III of FIG. 2.

Referring to FIGS. 2 and 3, the vertical mask ROM is constituted by a p$^-$-type semiconductor substrate (or a well region) 1 composed of single crystalline silicon. A field insulating film 2 and a p-type channel stopper region 3 are provided on the main surface between the semiconductor element-forming regions of the semiconductor substrate 1.

The vertical mask ROM include memory cells $M_1$, $M_3$, $M_5$, $M_7$ of odd-number columns constituted by the semiconductor substrate 1, a gate insulating film 4 and a gate electrode 5, and memory cells $M_2$, $M_4$, $M_6$, $M_8$ of even-number columns constituted by the semiconductor substrate 1, a gate insulating film 6 and a gate electrode 7. That is, the memory cell has a MIS structure which contains neither a semiconductor region that corresponds to the source region nor a semiconductor region that corresponds to the drain region of MISFET.

The gate electrodes 5 of memory cells M of odd-number columns are arranged maintaining a predetermined distance in the direction of gate length (direction of row in FIG. 2). The gate electrodes 5 are formed in a step of forming gate electrode of a first layer. The gate electrodes 5 are composed of, for example, a polycrystalline silicon film having a thickness of about 2000 to 3000 angstroms. Or, the gate electrodes 5 may be composed of a single layer of a high-melting metal silicide (MoSi$_2$, WSi$_2$, TaSi$_2$, TiSi$_2$) film or of a high-melting metal (Mo, W, Ta, Ti) film, or may be composed of a composite film obtained by laminating a metal film on the polycrystalline silicon film. For example, when a polysilicide film is obtained by laminating a high-melting metal silicide film on a polycrystalline silicon film, the polycrystalline silicon film should have a thickness of from 1500 to 2000 angstroms and the high-melting metal silicide film should have a thickness of from 1500 to 3000 angstroms.

The gate electrodes 7 of memory cells M of even-number columns are arranged among the first gate electrodes 5. Ends of the gate electrodes 7 are overlapped on the ends of the gate electrodes 5 by an amount that corresponds to a size of masking margin (e.g., about 0.5 $\mu$m) in the step of forming the gate electrodes 5. The gate electrodes 7 are formed in a step of forming gate electrodes of a second layer. For instance, the gate electrodes 7 are composed of a material equivalent to that of the gate electrodes 5 and maintaining a thickness substantially the same as that of the gate electrodes 5.

The gate electrodes 5 and the gate electrodes 7 are electrically isolated from each other by an interlayer insulating film (e.g., silicon oxide film) that is not denoted by numeral but that is formed on the surface of the gate electrodes 5.

Data are written onto memory cells $M_3$ and $M_7$ among the memory cells M of odd-number columns, and onto memory cells $M_2$ and $M_4$ among the memory cells M of even-number columns. In the memory cells M onto which data are written, impurities for writing data are introduced into the channel-forming region in the main surface of the semiconductor substrate 1 (in practice, this region is heat-treated to constitute a p-type semiconductor region) The memory cell M has been formed in advance (prior to writing data) by a threshold voltage of the depletion type; however, the threshold voltage is changed into the enhancement type by the introduction of impurities 9 for writing data.

The MISFET Qpc for selecting the above-mentioned eight stages of memory cells M is constituted by the semiconductor substrate 1, gate insulating film 4, gate electrode 5 (or 7), and a pair of n$^+$-type semiconductor regions 8 used as a source region and the drain region. The memory cells M are formed by nearly the same step as the one for forming MISFET Qpc. The ground potential wiring Vss is constituted by the semiconductor region 8.

A bit line 12 is connected to one semiconductor region 8 of the MISFET Qpc through a connection hole 11 formed in the interlayer insulating film 10. The interlayer insulating film 10 is formed, for example, by a composite film obtained by forming a BPSG film on a silicon oxide film formed by the CVD method. The bit line 12 is formed by an aluminum film, or a laminated film of an aluminum alloy to which Cu and/or Si are added and a high-melting metal silicide layer.

The method of producing the thus constituted vertical mask ROM and the method of writing data will now be described briefly in conjunction with FIGS. 4 to 8 (section views showing major portions for each of the manufacturing steps).

First, a $p^-$-type semiconductor substrate 1 composed of single crystalline silicon is prepared. The semiconductor substrate 1 has a surface concentration of about $1 \times 10^{12}$ to $2 \times 10^{12}$ [atoms/cm$^2$].

Next, a field insulating film 2 and a p-type channel stopper region 3 are formed on the main surface between the semiconductor element-forming regions of the semiconductor substrate 1.

Then, impurities 13 for adjusting the threshold voltage are introduced into the main surface of the MISFET-forming region in the semiconductor substrate 1. The impurities 13 may be As$^+$ ions that are implanted in an amount of, for example, about $2 \times 10^{12}$ to $3 \times 10^{12}$ [atoms/cm$^2$] at about 60 to 100 [KeVj]. Owing to the introduction of impurities 13, the threshold voltage is adjusted to that of the depletion type.

Referring to FIG. 4, a gate insulating film 4 is formed on the memory cell M-forming region and on the MISFET Qpc-forming region of the semiconductor substrate 1. The gate insulating film 4 is composed of a silicon oxide film formed by thermally oxidizing the main surface of the semiconductor substrate 1 at a temperature of 850° to 900° C., and has a thickness of about 125 to 300 angstroms.

Referring to FIG. 5, gate electrodes (first gate electrodes) 5 are formed on predetermined portions on the gate insulating film 4 by the step of forming gate electrodes of the first layer. The gate electrodes 5, in this case, are composed of a single layer of polycrystalline silicon film. The polycrystalline silicon film is formed by the CVD method. Prior to subjecting the polycrystalline silicon film to the patterning to form gate electrodes, the phosphorus concentration therein is set to be about $1 \times 10^{20}$ [atoms/cm$^{-3}$] by the treatment or implantation with phosphorus ions. Thereafter, the gate electrodes 5 are formed to form memory cells M of odd-number columns.

Next, the surface of the semiconductor substrate and the surface of the gate electrodes are thermally oxidized at 850° to 900° C. to form a silicon oxide film on the surface of the semiconductor substrate maintaining a thickness of 125 to 300 angstroms and to form a silicon oxide film on the surfaces of gate electrodes maintaining a thickness of 1000 to 2000 angstroms. The oxidation is effected utilizing the fact that the rate of oxidation of the polycrystalline silicon film in which phosphorus ions are introduced is greater than that of the surface of the semiconductor substrate. A thick silicon oxide film is formed on the surfaces of gate electrodes because of the reason that the silicon oxide film serves as an interlayer insulating film relative to the gate electrodes of the second layer to decrease the capacity that is formed relative to the gate electrodes of the second layer.

Referring to FIG. 6, the gate electrodes (second gate electrodes) 7 are formed on the gate insulating film 6 by the step of forming gate electrodes of the second layer. The gate electrodes 7 are composed of the polycrystalline silicon film in a manner as described above and have the same thickness at the gate electrodes of the first layer. Ends of the gate electrodes 7 are overlapped on the ends of the gate electrodes 5 by an amount that corresponds to the size of masking margin in the manufacturing step. By forming the gate electrodes 7, memory cells M of even-number columns are formed.

After the gate electrodes are formed, the surfaces of gate electrodes and the surface of the semiconductor substrate are thermally oxidized to form silicon oxide films maintaining thicknesses of about 500 angstroms and 100 to 200 angstroms, respectively.

Next, using the gate electrodes 5 and 7 as masks for introducing impurities, n$^+$-type semiconductor regions 8 are formed on the main surface of the semiconductor substrate 1 as shown in FIG. 7. The semiconductor regions 8 are formed by implanting As$^+$ ions or P$^+$ ions in amounts of $5 \times 10^{15}$ to $1 \times 10^6$ [atoms/cm$^2$ at 80 KeV or 60 KeV. Owing to the formation of semiconductor regions 8, the MISFET Qpc for selecting memory cells is formed (similarly, a MISFET is also formed for constituting the peripheral circuit).

Next, the step of writing data is effected. First, a mask 14 is formed on the whole surfaces of the gate electrodes 5 and 7 to introduce impurities for writing data. The mask 14 for introducing data-writing impurities has openings 14A for exposing the surfaces of the gate electrodes 5 or the gate electrodes 7. As shown in FIG. 8, the inner walls of the opening 14A in the direction of gate length are so formed as will be positioned in a region (within the size of masking margin in a manufacturing step) in which an end of the gate electrode 5 and an end of the gate electrode 7 are overlapped on each other. Further, the inner walls of the opening 14A in the direction of gate width are so formed as will be positioned on the outside of the gate width of the memory cell M by an amount at least corresponding to the size of masking margin in the manufacturing steps. The mask 14 for introducing the data-writing impurities is composed of, for example, a photoresist film.

Using the mask 14 for introducing data-wiring impurities as shown in FIG. 8, impurities 9 for writing data are selectively introduced into the channel-forming regions under the gate electrodes 5 or the gate electrodes 7 through gate electrodes 5 of memory cells M of odd-number columns or through gate electrodes 7 of memory cells M of even-number columns that are exposed through the openings 14A. The impurities 9 for writing data are composed of B$^+$ ions that are implanted at a concentration of about $7 \times 10^{12}$ to $9 \times 10^{12}$ [atoms/cm$^2$ with the energy of about 140 to 160 KeV. When the gate electrodes are composed of a polysilicide, the energy for ion implantation is from 140 to 300 KeV. Under such conditions, a maximum concentration of impurities 9 for writing data can be set in the channel-forming regions under the gate electrodes 5 and/or the gate electrodes 7. The impurities 9 for writing data are not introduced into the main surface of the semiconductor substrate 1 under the portions where the ends of the gate electrodes 5 and the ends of the gate electrodes 7 are overlapped since the film at such portions have a large thickness. That is, the impurities 9 for writing data are defined by the mask 14 for introducing data-writing impurities and by the overlapped portions, and are introduced into the channel-forming regions in a self-aligned manner under the gate electrodes 5 and/or the gate electrodes 7. The impurities for writing data are activated by the heat-treatment after they have been introduced. Introduction of impurities 9 for writing data changes the threshold voltage of the memory cell M from that of the depletion type to that of the enhancement type.

Figure 12:
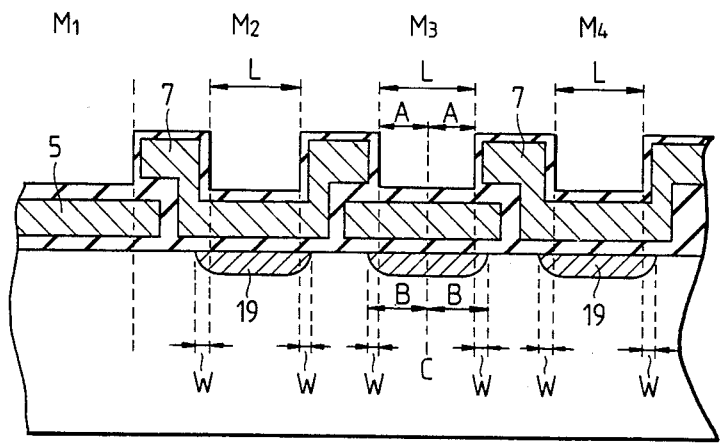
FIG. 12 is a diagram showing on an enlarged scale the channel portions of MISFET's $M_1$ to $M_4$ of memory cells.

Described below in conjunction with FIG. 12 is a relationship between the impurity region 19 constituted by impurities for writing data activated by the heat-treatment after they have been introduced and the gate electrodes of the first and second layers. FIG. 12 illustrates MISFET's $M_1$ to $M_4$ which constitute part of the memory cells. Here, the impurity region is not shown that is constituted by impurities that are introduced for forming depletion-type MISFET's.

To form MISFET's of the enhancement-type, ions are implanted from portions denoted by "L" in FIG. 12. Impurities implanted in the surface of the semiconductor substrate are diffused by the heat-treatment for activation, i.e., diffused by an equal distance "w" in the direction of gate length. If explained with reference to, for example, MISFET $M_3$, both ends of the impurity region 19 are located at an equal distance in the direction of gate length from the ends of the gate electrode of the second layer. If an imaginary line c is presumed to exist midway between the ends of the neighboring gate electrodes of the second layer, ends of the impurity layer 19 exist at positions on both sides of the imaginary line c being separated away therefrom by an equal distance B.

Thus, in a semiconductor integrated circuit device having a vertical mask ROM of the double-layer gate structure, the gate electrodes 5 and gate electrodes 7 are successively formed, impurities 9 are introduced into the channel-forming regions through predetermined gate electrodes 5 and/or gate electrodes 7 to write data after the gate electrodes 5 and gate electrodes 7 have been formed. Therefore, the vertical mask ROM can be produced within reduced periods of time.

Further, impurities 9 for writing data are introduced without passing through portions where the ends of the gate electrodes 5 and the ends of the gate electrodes 7 are overlapped. That is, being defined by the overlapped portions, the impurities 9 for writing data are introduced into the channel-forming regions under predetermined gate electrodes 5 and/or gate electrodes 7 only. Thus, the impurities 9 for writing data are introduced being self-aligned to the gate electrodes 5 and/or the gate electrodes 7. That is, the area of the memory cell M can be reduced in the direction of gate length, enabling the integration degree of the vertical mask ROM to be increased.

The channel length of a MISFET, e.g., $M_3$ constituted by the gate electrodes of the first layer is determined by a distance between the gate electrodes of MISFET's $M_2$ and $M_4$. Therefore, the channel length does not change irrespective of the masking deviation; i.e., a constant channel length is obtained. In other words, a constant mutual conductance gm is obtained at all times.

The channel length of a MISFET, e.g., $M_2$ constituted by the gate electrodes of the second layer is determined by a distance between the gate electrodes of the MISFET's $M_1$ and $M_3$. Therefore, a MISFET having a constant mutual conductance gm is obtained as described above.

After the step of writing data, the mask 14 for introducing the data-writing impurities is removed.

Then, an $SiO_2$ film is formed maintaining a thickness of 1500 angstroms and a BPSG (boron phosphosilicate glass) film is formed maintaining a thickness of 400 angstroms by the CVD method in order to form an interlayer insulating film 10 and connection holes 11 successively. Thereafter, bit lines 12 are formed as shown in FIGS. 2 and 3, and a plasma nitride film is formed thereon maintaining a thickness of 1.2 $\mu$m to complete the vertical mask ROM of the double-layer gate structure in accordance with the embodiment. The bit lines are comprised of a molybdenum silicide film having a thickness of 150 to 300 angstroms and an aluminum film having a thickness of 8000 angstroms formed thereon.

In the vertical mask ROM of the present invention, the step of writing data may be carried out after the interlayer insulating film 10 or the bit line 12 has been formed. Described below is an embodiment in which the step of writing data is executed after the bit lines 12 have been formed.

Figure 9:
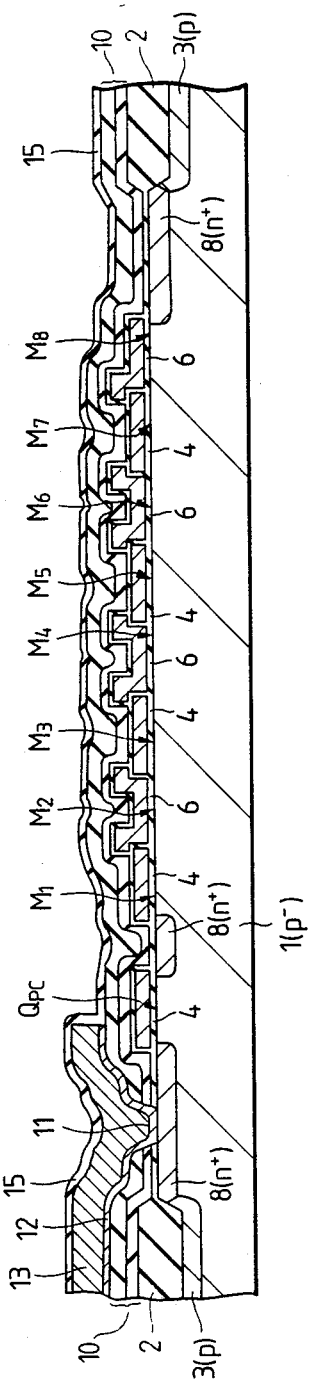
FIGS. 9 and 10 illustrate another embodiment of a method of producing the vertical mask ROM according to the present invention.

After the steps have been finished up to FIG. 7 in the above-mentioned embodiment, an interlayer insulating film composed of CVD-$SiO_2$ of a thickness of about 1500 angstroms and BPSG of a thickness of about 4000 angstroms is formed as shown in FIG. 9 without effecting the step of writing data. Then, a connection hole 11 is formed in the drain region of MISFET Qpc. Thereafter, there are formed bit lines composed of a molybdenum silicide film having a thickness of 150 to 300 angstroms and an aluminum film that contain Cu and Si having a thickness of 8000 angstroms formed thereon. Further, a protection film composed of silane is formed by the CVD method maintaining a thickness of 1000 to 2000 angstroms. Like FIG. 3, FIG. 9 is a section view along the line III—III of FIG. 2.

Figure 10:
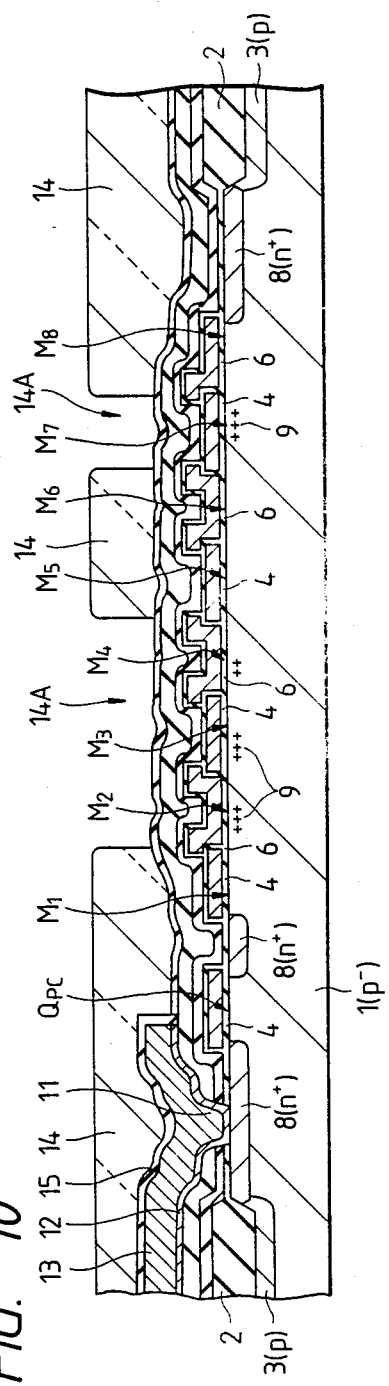

Next, the mask 14 for introducing data-writing impurities is formed on the protection film 15. Referring to FIG. 10, the impurities 9 for writing data are introduced into the channel-forming regions of predetermined memory cells M through openings 14A in the mask 14 thereby to write data. The data are written by implanting, for example, $B^+$ions at a concentration of about $7 \times 10^{12}$ to $9 \times 10^{12}$ [atoms/cm$^2$ with the energy of about 300 KeV. The mask 14 for introducing impurities for writing data is composed of a photoresist film.

The protection film 15 is formed so as to withstand the washing in the steps of applying a photoresist film, developing and peeling, as well as to withstand the wet processing such as treatment with a developing solution and treatment with a peeling solution. That is, the protection film 15 is formed such that the bit lines 13 composed of aluminum or an alloy thereof will not be corroded.

In particular, when copper is added to the bit lines 13 to decrease migration thereof, corrosion easily takes place in the aluminum alloy. The protection film of the present invention is particularly effective for the vertical mask ROM that uses aluminum alloy containing copper.

The protection film is in no way limited to the silane film only, but may be, for example, a nitride film or a polycrystalline silicon film.

After the data are written, the mask 14 for introducing the data-writing impurities is removed. Next, a passivation film composed, for example, of a plasma nitride film is formed maintaining a thickness of about 1.2 μm on the protection film 15. Thereafter, the data-writing impurities 9 introduced in the step of writing the data are activated.

According to this embodiment, the time for completing the product mentioned in the foregoing embodiment can be further shortened.

Figure 11:
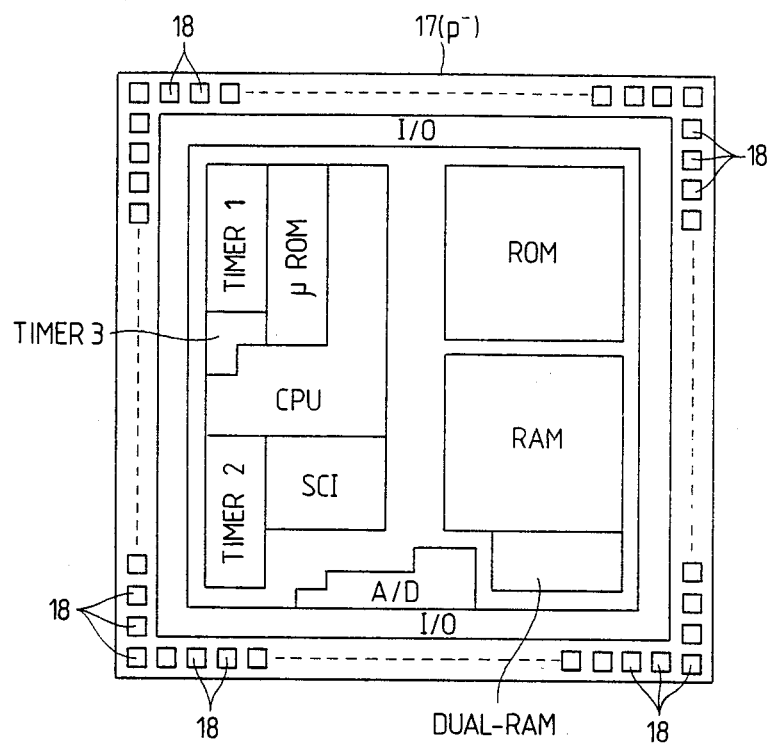
FIG. 11 is a block diagram of a microcomputer on which is mounted the vertical mask ROM of the present invention.

FIG. 11 is a block diagram of a microcomputer to which the vertical mask ROM of the present invention is adapted.

In FIG. 11, reference numeral 17 denotes a semiconductor substrate (chip) composed of p⁻-type single crystalline silicon having a plurality of bonding pads 18 arranged around the periphery thereof. An input/output circuit region I/O is provided on the inside of the bonding pads 18. The chip 17 shown in FIG. 11 contains a micro ROM, a CPU (central processing unit), an SCI (serial communication interface), an A/D (analog-digital converter) circuit, a dual-RAM (dual port random access memory), a RAM, a ROM, a timer 1, a timer 2 and a timer 3.

With the vertical ROM of the present invention being adapted to the micro ROM and or ROM, the time can be reduced from the step of writing data to the completion of the product.

In the foregoing was concretely described the invention accomplished by the present inventor by way of embodiments. The invention, however, is in no way limited to the aforementioned embodiments only but can be modified in a variety of other ways without departing from the spirit and scope of the invention.

What is claimed is:

1. A method of producing semiconductor integrated circuit devices, comprising:
   (a) a step for introducing impurities into the surface of a semiconductor material having a first type of conductivity, said impurities having a second type of conductivity that is opposite to said first type of conductivity;
   (b) a step for forming a plurality of first conductive layers maintaining an equal distance on the surface of said semiconductor material;
   (c) a step for forming a plurality of second conductive layers among said plurality of first conductive layers on the surface of said semiconductor material, in such a manner that said second conductive layers are partly overlapped on said first conductive layers;
   (d) a step for forming a masking layer having openings at positions corresponding to particular ones of said plurality of first conductive layers or said plurality of second conductive layers; and
   (e) a step for selectively introducing impurities of the first conductivity type into the openings utilizing said masking layer;
   wherein said first and second conductive layers constitute gate electrodes of MISFET's that are connected in series.

2. A method of producing semiconductor integrated circuit devices according to claim 1, wherein said impurities having the first conductivity type are introduced through the first or the second conductive layers into the surface of said semiconductor material of the regions other than those regions where said first conductive layers and said second conductive layers are overlapped.

3. A method of producing semiconductor integrated circuit devices according to claim 2, further comprising:
   a step for forming a thermal oxide film on the surface of said semiconductor material prior to forming said first conductive layers.

4. A method of producing semiconductor integrated circuit devices according to claim 3, further comprising:
   a step for forming a thermal oxide film on the surfaces of said first conductive layers and said semiconductor material between said steps (b) and (c).

5. A method of producing semiconductor integrated circuit devices according to claim 4, further comprising:
   a step for introducing impurities having the second conductivity type into ends on both sides of said first and second conductive layers that are continuously formed using said first or second conductive layers as masks, after said step (c) has been finished.

6. A method of producing semiconductor integrated circuit devices, comprising:
   (a) a step for introducing impurities into the surface of a semiconductor material having a first type of conductivity, said impurities having a second type of conductivity that is opposite to said first type of conductivity;
   (b) a step for forming a plurality of first conductive layers maintaining an equal distance on the surface of said semiconductor material;
   (c) a step for forming a plurality of second conductive layers among said plurality of first conductive layers on the surface of said semiconductor material, in such a manner that said second conductive layers are partly overlapped on said first conductive layers;
   (d) a step for forming a first insulating film on said semiconductor material and on the first and second conductive layers;
   (e) a step for selectively forming a third conductive layer on said first insulating film;
   (f) a step for forming a second insulating film on said first insulating film and on said third conductive layer;
   (g) a step for forming a masking layer on said second insulating film;
   (h) a step for selectively removing said masking layer using said second insulating film as an etching preventing film; and
   (i) a step for selectively introducing impurities of the first type of conductivity into the openings utilizing said masking layer;
   wherein said first and second conductive layers constitute gate electrodes of MISFET's that are connected in series.

7. A method of producing semiconductor integrated circuit devices according to claim 6, wherein said impurities having the first conductivity type are introduced through the first or the second conductive layers into the surface of said semiconductor material of the regions other than those regions where said first conductive layers and said second conductive layers are overlapped.

8. A method of producing semiconductor integrated circuit devices according to claim 7, further comprising:

a step for forming a thermal oxide film on the surface of said semiconductor material prior to forming said first conductive layers.

9. A method of producing semiconductor integrated circuit devices according to claim 8, further comprising:
a step for forming a thermal oxide film on the surfaces of said first conductive layers and said semiconductor material between said steps (b) and (c).

10. A method of producing semiconductor integrated circuit devices according to claim 9, further comprising:
a step for introducing impurities having the second conductivity type into ends on both sides of said first and second conductive layers that are continuously formed using said first or second conductive layers as masks, after said step (c) has been finished.

11. A method of producing semiconductor integrated circuit devices according to claim 10, wherein the step of forming said first insulating film consists of a step of forming a silicon oxide film and a step of forming a BPSG.

12. A method of producing semiconductor integrated circuit devices according to claim 10, wherein the step of forming said third conductive layer consists of a step of forming a high-melting metal silicide layer and a step of forming an aluminum alloy layer.

* * * * *